United States Patent [19]
Horiuchi et al.

[11] Patent Number: 5,464,950
[45] Date of Patent: Nov. 7, 1995

[54] ALUMINUM NITRIDE CIRCUIT BOARD AND METHOD OF PRODUCING SAME

[75] Inventors: Michio Horiuchi; Yoichi Harayama; Koishiro Hayashi, all of Nagano, Japan

[73] Assignee: Shinko Electric Industries Co., Ltd., Nagano, Japan

[21] Appl. No.: 115,767

[22] Filed: Sep. 3, 1993

[30] Foreign Application Priority Data

Sep. 5, 1992 [JP] Japan .................................. 4-262928
Sep. 9, 1992 [JP] Japan .................................. 4-266735
Oct. 12, 1992 [JP] Japan .................................. 4-299912

[51] Int. Cl.$^6$ .................................................. H05K 1/00
[52] U.S. Cl. .......................... 174/256; 174/250; 174/257; 174/258; 174/262
[58] Field of Search ...................... 174/250, 255, 174/256, 257, 258, 262, 263

[56] References Cited

U.S. PATENT DOCUMENTS 4,906,404  3/1990  Suehiro et al. .
5,229,213  7/1993  Horiuchi et al. ........................ 428/457

FOREIGN PATENT DOCUMENTS 2197189  8/1990  Japan .

OTHER PUBLICATIONS

*Patent Abstracts Of Japan*, vol. 12, No. 219 (C–506), Jun. 22, 1988 & JP–A–63 015866 (Copal Co Ltd), Jan. 22, 1988.
*Patent Abstracts Of Japan*, vol. 14, No. 414 (E–0975), Sep. 7, 1990 & JP–A–02 159096 (Fujitsu Ltd), Jun. 19, 1990.
*Patent Abstracts Of Japan*, vol. 16, No. 23 (E–1157), Jan. 21, 1992 & JP–A–03 240289 (Fujitsu Ltd), Oct. 25, 1991.
*Patent Abstracts Of Japan*, vol. 16, No. 97 (E–1176), Mar. 10, 1992 & JP–A–03 276797 (Fujitsu Ltd), Dec. 6, 1991.
*Patent Abstracts Of Japan*, vol. 16, No. 196 (E–1200), May 12, 1992 & JP–A–04 028294 (Ibiden Co Ltd), Jan. 30, 1992.
*Patent Abstracts Of Japan*, vol. 16, No. 372 (E–1246), Aug. 11, 1992 & JP–A–04 118990 (Fujitsu Ltd), Apr. 20, 1992.

*Database WPI*, Week 8847, Derwent Publications Ltd., London, GB; AN 88–332648 & JP–A–63 244521 (Murata Mfg Co), Oct. 12, 1988.
*Database WPI*, Week 9115, Derwent Publications Ltd., London, GB; AN 91–105450 & JP–A–03 046705 (Showa Denko KK), Feb. 28, 1991.
Iwase et al., "Aluminum Nitride Multi–Layer Pin Grid Array Packages," *Proceeding Of 37th Electronic Components Conference*, May 11–13, 1987, Boston, pp. 384–391.
A. H. Carim, "High–Resolution Electron Microscopy of Interfaces in AlN–Braze Metal Alloy Systems," *Material Research Society Symposium Proceeding*, vol. 159, 1990, pp. 425–430.
Anderson et al., "Brazing of Aluminum Nitride," *The International Journal For Hybrid Microelectronics*, vol. 14, No. 4, Dec. 1991, pp. 121–128.
Taniguchi Yoshiaki, *Patent Abstracts of Japan*, "Electrically Conductive Composition For Thick–Film Paste" vol. 012, No. 219, Jun. 22, 1988.
*Database WPI*, "Conductive Paste Made Of Sintered Aluminum Nitride—Contains Tungsten Or Molybdenum With Oxide(s) Of Calcium, Barium, Strontium, Titanium, Niobium And/Or Rare Earth Metal", Week 8847, Derwent Publications Ltd., London, GB.

(List continued on next page.)

Primary Examiner—Leo P. Picard
Assistant Examiner—Cheryl R. Figlin
Attorney, Agent, or Firm—Staas & Halsey

[57] ABSTRACT

An aluminum nitride circuit board includes an aluminum nitride ceramic body. An inner conductor metal which is to be used as a wiring material is formed in the aluminum nitride ceramic body. The inner conductor metal is mainly made of copper, a melting point of which is lower than a firing temperature of the aluminum nitride ceramic. A layer mainly made of a periodic table IVa group metal or compound, such as titanium, zirconium, or hafnium, is formed in an interface between the aluminum nitride ceramic body and the inner conductor metal.

2 Claims, 6 Drawing Sheets

OTHER PUBLICATIONS

*Database WPI*, "Copper Paste For Printed Circuit Boards—Prepared By Kneading Solid Component Contg. Glass Powder With Vehicle Component And Copper Powder For Improved Attached Strength", Week 9115, Derwent Publications Ltd., London, GB.

Omote Koji et al., *Patent Abstracts of Japan*, "Manufacture Of Aluminum Nitride Board", vol. 016, No. 097, Jan. 1992.

Suzuki Takahiko et al., *Patent Abstracts of Japan*, "Manufacture Of Aluminum Nitride Substrate", vol. 015, No. 023, Jan. 1992.

ALUMINUM NITRIDE CIRCUIT BOARD AND METHOD OF PRODUCING SAME

BACKGROUND OF THE INVENTION

1. Field of the Invention

The present invention relates to an aluminum nitride circuit board and a method of producing same, and more particularly, to an aluminum nitride circuit board used in a semiconductor device assembly, etc., and a method of producing same.

2. Related Art

Recently, as the operating speed and output of semiconductor elements increase and the semiconductor elements become more highly integrated, in order to put these elements into practical use, it is important to improve the heat radiating properties, reduce the resistance of the conductor portion, and reduce the dielectric constant of the base portion of the circuit board which supports the elements.

Aluminum nitride ceramics is used as a practical material to solve the aforementioned technical problems. As compared with alumina ceramics that have been used for this purpose, aluminum nitride ceramic has a high thermal conductivity, a low dielectric constant, and a low thermal expansion coefficient. Accordingly, aluminum nitride ceramics is practically suitable for use with large-sized silicon elements of high output.

Therefore, a circuit board, the base plate of which is made of aluminum nitride ceramics, has been developed for assembling semiconductor devices.

In the case where a wiring pattern is formed on or in a ceramic circuit board, it is possible to form a wiring pattern on an outer surface of the base plate by means of a conventional thin film forming method or metalizing after firing. However, concerning a conductor portion formed inside the circuit board, the internal conductor wiring must be provided before firing and metalized in a co-firing process.

Conventionally, tungsten is used as a metalizing material in the co-firing process. However, the specific resistance of tungsten is higher than that of copper or gold. Therefore, when tungsten is used for signal transmission, power is lost, and further the transmission speed is lowered. Accordingly, tungsten is not suitable for the wiring material.

In order to solve the above problems, the inventors have proposed a method for producing aluminum nitride circuit boards in which a low resistance material such as copper, gold and silver is used as a metalizing material instead of tungsten (disclosed in Japanese Unexamined Patent Publication (Kokai) No. Hei. 2-197189). According to this method, green sheets, on which a predetermined wiring pattern and via hole connecting portions are formed using a conductor paste of copper, gold, silver, or the like, are laminated and protective green sheets are further layered on outer surfaces of the laminated body, so that the wiring patterns are covered with the protective green sheets. Then, the laminated body is fired. After the firing, the layers covering the surfaces of the laminated body is ground so that the wiring patterns are exposed to the outside and thus a circuit board is obtained.

The aforementioned aluminum nitride circuit board, in which a low resistance material such as copper, gold and silver is used for the metalizing material, has excellent electrical characteristics. However, according to the producing method of the prior art, after the aluminum nitride layered body has been fired, the protective, aluminum nitride green sheet must be ground in order to expose the wiring pattern. This grinding work takes much time. Accordingly, the product cost is raised due to the grinding or polishing work. In the case where a plane grinder is used for grinding, a large amount of shavings are produced, and further a large amount of gas is generated, which causes some operational problems.

In the aforementioned producing method, the melting point of a conductor metal such as copper and gold used for the wiring pattern is lower than the firing temperature of aluminum nitride ceramics. Therefore, the following problems may be encountered: When a green sheet is fired, a conductor paste is melted, so that a volume of the conductor paste is reduced, and vacancies are generated in the conductor portion which result in the breakage of wire.

In the case of the aforementioned method for producing circuit boards (disclosed in Japanese Unexamined Patent Publication (Kokai) No. Hei. 2-197189), copper is most preferably used for the conductor metal. In the case where copper is used for the conductor metal, it can be preferably co-fired at a temperature not less than 1,800° C., and the sintering additive is hardly mixed with the conductor portion. On the other hand, in the case where silver is used for the conductor metal, it is difficult to co-fire at a firing temperature exceeding 1,700° C., and in the case of gold, it was recognized that the sintering additive component was mixed with the conductor portion.

Copper can be preferably used for the conductor material in the process of co-firing. However, in the case of copper, the sintering additive is hardly mixed into the conductor, and material is hardly moved through an interface between the conductor portion and the ceramics. Therefore, an adhesive force between the conductor portion and the ceramics is mainly generated by a mechanical action caused by the interlock mechanism, so that the connection between the conductor portion and the ceramic is generally weak. Consequently, the adhesive force between the conductor portion and the ceramics is weak.

As a result, in the case where copper is used for the conductor material, the following problems arise: the adhesive strength of the inner conductor portion which has been exposed onto the sintered body surface by grinding is weak; and in the case of a circuit board on which a large number of via hole portions are formed, the circuit board tends to crack on the interface between the via hole portions and the ceramic. Further, the wetting properties between melted copper and aluminum nitride ceramics are not good when copper is melted in the process of firing. Therefore, the melted copper is separated into several portions in he middle of the wiring, which causes breaking of the wire (i.e., electrical open).

SUMMARY OF THE INVENTION

An object of the present invention is to provide an aluminum nitride ceramic circuit board and a method of producing the same, in which the adhesive strength between copper and aluminum nitride ceramics can be increased and, therefore, the problem that the circuit board tends to be broken on the interface between copper and aluminum nitride ceramic can be overcome and electrical open can also be avoided.

It is another object of the present invention to provide a method of producing aluminum nitride circuit boards, in which, after firing, the base plate surface can be easily ground so that the wiring pattern is economically exposed.

According to one aspect of the present invention, there is provided an aluminum nitride circuit board comprising: an aluminum nitride ceramic body; an inner conductor metal, which is to be used as a wiring material, formed in said aluminum nitride ceramic body, said inner conductor metal being mainly made of copper, the melting point of which is lower than a firing temperature of said aluminum nitride ceramic body; and a layer mainly made of a periodic table IVb group metal or compound, such as titanium, zirconium, or hafnium, formed in an interface between said aluminum nitride ceramic body and said inner conductor metal.

According to another aspect of the present invention, there is provided a method of producing an aluminum nitride circuit board comprising the following steps of: preparing one or more green sheets of aluminum nitride; providing, on said green sheet, a conductor wiring portion, such as a plane wiring portion or a via hole portion, with a copper paste mainly made of copper, the melting point of which is lower than the firing temperature of said aluminum nitride ceramic body, to said copper paste a periodic table IVb group metal or compound, such as titanium, zirconium, or hafnium is added; layering, on an outer surface of said green sheet, one or more other green sheets, if any; covering an outer surface of said green sheet with a protective green sheet of aluminum nitride to form a unitary body, so that said conductor wiring portion exposed onto the outer surface of said green sheet is covered with said protective green sheet; sintering said unitary body under a predetermined treatment and firing conditions; and removing an outer layer covering said outer surface of said sintered body by grinding and polishing.

According to still another aspect of the present invention, there is provided a method of producing an aluminum nitride circuit board comprising the following steps of: preparing one or more green sheets made of aluminum nitride powder; providing, on said green sheet, a conductor wiring portion, such as a plane wiring portion or a via hole portion, with a metallic paste mainly made of copper, gold, or silver; the melting point of which is lower than the firing temperature of said aluminum nitride ceramic body; layering, on an outer surface of said green sheet, one or more other green sheets, covering an outer surface of said green sheet with a protective paste of aluminum nitride to form a unitary body, so that said conductor wiring portion exposed onto the outer surface of said green sheet is covered with said protective paste; sintering said unitary body under a non-oxidizing atmosphere; and removing an outer layer covering said outer surface of said sintered body by grinding and polishing, so that at least a part of said conductor wiring portion is exposed to an outer surface of said unitary body.

According to further aspect of the present invention, there is provided a method of producing an aluminum nitride circuit board comprising the following steps of: preparing a plurality of green sheets made of aluminum nitride powder; providing, on at least one of said green sheets, a conductor wiring portion, such as a plane wiring portion and a via hole portion, with a metallic paste mainly made of copper, gold, or silver, the melting point of which is lower than the firing temperature of said aluminum nitride; providing, on said green sheet which is to be layered at a higher position than said green sheet having said conductor wiring portion, a pool portion for said metallic paste, so that said pool portion is communicated to said conductor wiring portion; supplying a necessary amount of metallic paste in said pool portion for communicating with said conductor wiring portion; layering said plurality of green sheets to form a unitary body; and sintering said unitary body under a non-oxidizing atmosphere.

DETAILED DESCRIPTION OF THE INVENTION

First Embodiment

Figure 1A:
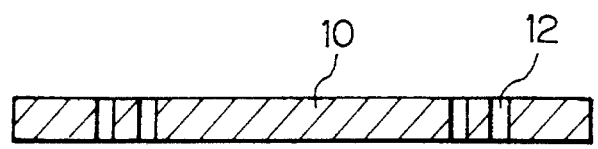
FIGS. 1(a)–1(d) are schematic illustrations for explaining a method of producing aluminum nitride circuit boards.

The method of producing aluminum nitride circuit boards of the first embodiment is based on the concept in which: when a conductor portion such as wiring pattern is formed by means of co-firing, a vaporization loss of metal such as copper used for wiring material, can be suppressed by an aluminum nitride paste, wherein the vaporization loss is caused when copper is melted during the firing process since the melting point of copper is lower than the firing temperature of a base plate.

A circuit board having a conductor portion of low resistance such as copper is frequently applied to a package main body for high density and output. When the conductor portion is formed on the outer surface of the package main body, a thin film formation method is frequently used since a high density wiring can be formed by the method. Accordingly, in order to connect the conductor portion on the outer surface with the inner conductor portion, in many cases, it is sufficient that a via hole end surface is exposed onto the outer surface of the circuit board.

When the end face of the conductor portion is coated with a dense aluminum nitride paste, it is possible to prevent the vaporization loss of wiring material with respect to the circuit board, on the outer surface of which the via hole end face is exposed. In this way, the vaporization loss of wiring material can be sufficiently prevented.

In order to provide sufficient densification speed and density, the aluminum nitride paste used for the method of this embodiment is preferably made of aluminum nitride powder, the average grain size of which is not more than 2 μm. At least one of the periodic table IIa group compounds and IIIb compounds is added to this aluminum nitride powder in an amount of not less than 0.1% by weight and not more than 10% by weight, and preferably the compounds, the composition of which is the same as that of the additive contained in the aluminum nitride green sheet, are added so that the addition ratio can be more than the ratio of the additive contained in the aluminum nitride green sheet.

A preferable example of the additive is as follows: one of $CaCO_3$, $Y_2O_3$, $YF_3$, $La_2O_3$ and $LaF_3$ is added in an amount of not more than 5% by weight and not less than 0.2% by weight.

An organic solvent such as ethanol is added to the aforementioned mixture. Then, the mixture is sufficiently mixed by a ball mill for 12 to 24 hours. After that, the mixture is dried, and butyl carbitol acetate, terpineol and vehicle mainly composed of acrylic binder are added, and then the mixture is sufficiently kneaded by a kneader for 1 to 3 hours, so that an aluminum nitride paste is obtained.

In this connection, an aluminum nitride paste made of raw material powder prepared in the following manner can provide an excellent result: a green sheet is employed, the composition of which is the same as that of the aforementioned aluminum nitride green sheet; and an organic component is removed from the green sheet in the air at a temperature of about 500° C.

In the case where a conductor portion provided on the aluminum nitride green sheet is covered with the aforementioned aluminum nitride paste, a screen print method or a dot print method can be employed. The coating thickness depends on an exposed area of the conductor on the outer surface, however, it is preferable that the coating thickness is not less than 20 μm and not more than 200 μm.

The aluminum nitride paste may be coated on the conductor portion on the outer surface of the aluminum nitride green sheet before the aluminum nitride green sheet is layered or after the aluminum nitride green sheet has been layered. In the case where the aluminum nitride green sheet is layered, the operation may be carried out in the following manner: After the aluminum nitride paste has been coated, the green sheet is once heated and pressed toward the layer so that the density of the aluminum nitride paste can be slightly increased and also the aluminum nitride paste can be slightly embedded in the aluminum nitride green sheet for improving the fastening properties and the flatness.

After the aluminum nitride green sheet has been layered, the binder is removed from the layered body. After that, the temperature is raised at a rate of not less than 10° C./min, and preferably at a rate 20° to 25° C./min. Then, the layered body is sintered at a temperature of not less than 1,600° C., and preferably at a temperature not less than 1,750° C. and not more than 1,850° C. In this way, a sintered body can be provided.

A firing jig may be made of aluminum nitride, tungsten, molybdenum or boron nitride. It is preferable to use a firing jig made of boron nitride having a cell structure.

The thus obtained sintered body is ground or polished so that the conductor portion is exposed at the surface of the sintered body. After the conductor portion has been exposed, in accordance with requirements, a surface wiring pattern is formed on the surface of the sintered body by a thick film method or a thin film method.

In the case of the method of this embodiment the aluminum nitride paste can be thinly coated on the conductor portion as compared with the aluminum nitride green sheet. Therefore, unnecessary portions can be easily removed. Accordingly, even when an abrasive liquid circulation type polisher is employed, the smell of ammonia ($NH_3$) gas can be avoided, and processing powder does not remain. Therefore, the polishing work can be completed in a short period of time.

Example 1

With reference to FIGS. 1(a)–1(d), the first embodiment of the present invention will be explained as follows.

To an aluminum nitride powder having an average grain size of about 1 μm obtained by a reducing nitride (also called "carbothermal") process, yttrium oxide in an amount of 3% by weight, as a sintering additive organic binder, plasticizer and organic solvent were added, and the mixture was made to be slurry by a ball mill, and then a green sheet of 0.4 mm thickness was formed by the doctor blade process.

After the obtained green sheet had been punched to a predetermined size, through-holes were formed by means of punching. FIG. 1(a) shows a state in which the through-holes 12 were formed on the green sheet 10 of aluminum nitride.

Figure 1B:
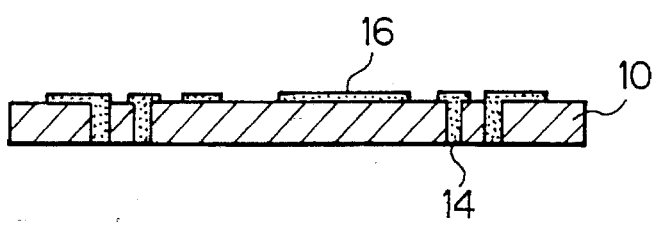

Then, with a copper paste made of copper powder, the average grain size of which was about 2 μm, the aforementioned through-hole 12 was filled so that via hole portions 14 were formed. Then, a wiring pattern 16 was formed on the green sheet by the screen printing process as shown in FIG. 1(b).

In the same manner as described above, each green sheet composing the layered body was formed. In this example, 5 green sheets were prepared to form the layered body.

When the green sheets were layered, an end face of the via hole portion was exposed onto the outermost 10 surface of the layered body. The end face of the via hole portion 14 was covered with an aluminum nitride paste 18 with respect to the outermost green sheet.

The aluminum nitride paste 18 was formed in the following manner: A vehicle containing butyl carbitol acetate, terpineol and acrylic binder was added to aluminum nitride powder, and then the mixture was kneaded by a kneader for 2 hours.

Figure 1C:
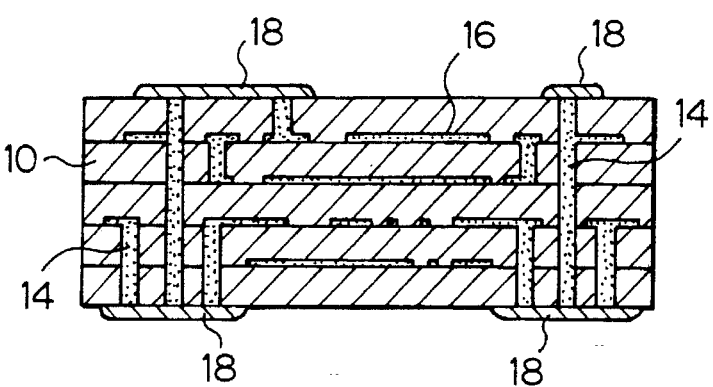

Next, the green sheets, the via hole end faces of which were covered with the aluminum nitride paste 18, were provided on both outer surfaces of the layered body so as to form the outer layers, and 5 green sheets 10 were layered, and the layered body was thermally pressed by a pressure of 200 kgf/cm$^2$ at a temperature of 60° C. for 5 minutes. In this way, the layered body was integrated into one body. FIG. 1(c) shows a layered body in which the green sheets were layered and integrated into one body. The wiring patterns 16 were layered in the layered body, and the layers were electrically connected by the via hole portions 14.

Next, the binder of the green sheet layered body was removed in a flow of nitrogen gas at a temperature of 550° C., and then the layered body was fired in nitrogen gas under the following conditions: the atmospheric pressure was 5 kgf/cm$^2$; the temperature increase rate was 25° C./min; the maximum temperature was 1,800° C.; and the holding time was 3 hours.

Both surfaces of the obtained sintered body were ground with a plane grinder, so that the aluminum nitride paste 18 was removed from the surface of the layered body so as to expose the end faces of the via hole portion 14.

After that, a surface wiring pattern 20 was formed on the surface of the layered body. In the case where the surface wiring pattern 20 is formed, the vapor deposition process may be employed.

Figure 1D:
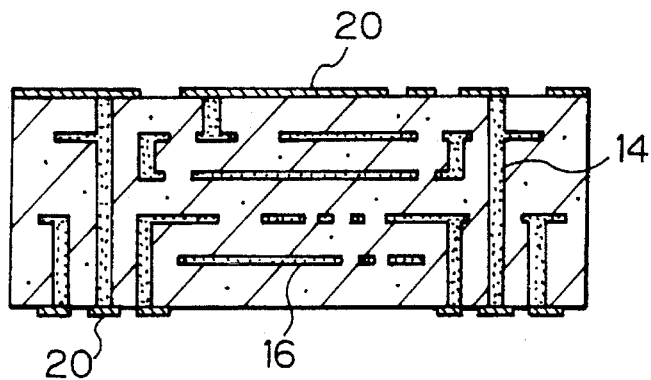

FIG. 1(d) shows an aluminum nitride circuit board obtained in the aforementioned manner. The conductor pattern on the aluminum nitride circuit board of this example is made of copper of low resistance. Therefore, excellent electrical characteristics can be provided. Whereas the material of the circuit board is aluminum nitride, the circuit board has excellent heat radiating properties. Therefore, the circuit board of the Example 1 can be preferably used for the assembly of highly-integrated silicon elements.

In the Example 1 described above, copper paste was used for the wiring material, however, it is possible to form a multi-layered body in the same manner when gold or silver paste is used. These wiring materials can be effectively used for improving the electrical characteristics of the circuit board.

The aforementioned Example 1 describes a multilayered circuit board on which a plurality of green sheets are layered. However, the above example can be applied to a circuit board of a single layer in the same manner.

Second Embodiment

Figure 2:
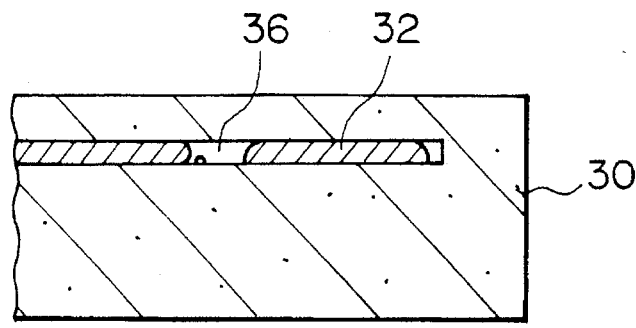
FIG. 2 is a schematic illustration showing a situation of the breakage of wire caused in a conductor portion of an aluminum nitride circuit board.
Figure 3A:
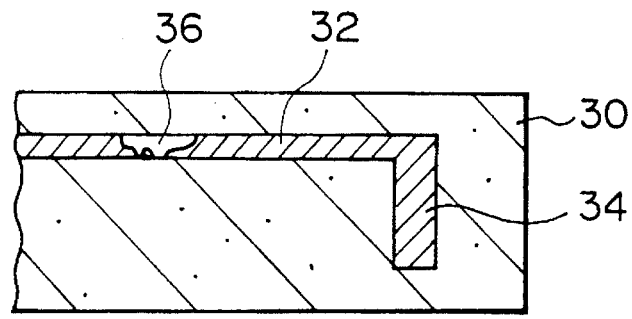
FIGS. 3(a) and 3(b) are schematic illustrations showing a situation of the breakage of wire caused in a conductor portion of an aluminum nitride circuit board.
Figure 3B:
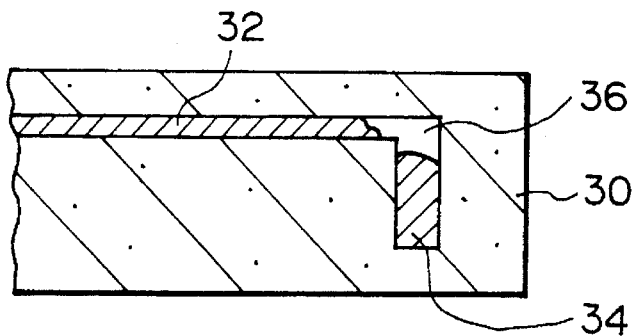

FIG. 2 and FIGS. 3(a) and 3(b) show situations in which the breakage of wire has been caused when the wiring material on an aluminum nitride circuit board is melted. FIG. 2 shows a situation of the breakage of wire which has been caused in the plane pattern portion. FIGS. 3(a) and 3(b) show a situation of the breakage of wire which has been caused in a via hole portion and a plane pattern portion connected with the via hole portion.

When the green sheet is fired, the green sheet shrinks, and the volume of the wiring pattern 32 and the via hole portion 34 are also reduced, so that the decrease in volume of the wiring material can be made up. However, in general, the decrease in volume of the wiring material is larger than that of the green sheet volume. As a result, the blow hole 36 is generated, which results in the breakage of wire.

Figure 4A:
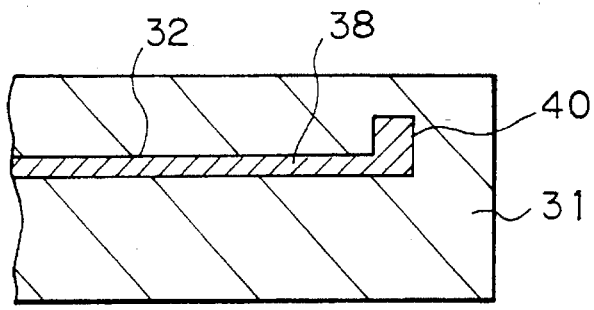
FIGS. 4(a) and 4(b) are sectional views of a green sheet forming an aluminum nitride circuit board.
Figure 4B:
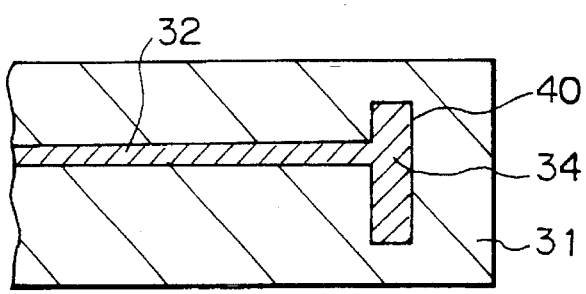

In order to avoid such blow holes 36, as shown in FIGS. 4(a) and 4(b), the method of producing aluminum nitride circuit boards of the second embodiment is conducted as follows: When a metalizing pattern, such as on a green sheet 31, wiring pattern 32 and via hole portion 34, is formed, it is necessary that the metalizing pattern is communicated with a position located higher than the metalizing pattern when the green sheet is fired. At the higher position, a pool portion 40 for charging a metalizing paste 38 is provided. When a volume of the metalizing paste is decreased in the process of firing, a necessary amount of metalizing paste is supplied to the conductor portion from the pool portion 40. Consequently, the breakage of wire can be prevented in the conductor portion.

FIG. 4(a) shows a case in which the green sheet is composed of only the wiring pattern 32 disposed on a plane. FIG. 4(b) shows a case in which the green sheet is composed of the wiring pattern 32 disposed on a plane and also composed of a via hole portion 34. In FIG. 4(a), the pool portion 40 is provided at the end of the wiring pattern 32, and in FIG. 4(b), the pool portion 40 is provided in the upper portion of the via hole portion 34 in such a manner that the via hole portion 34 is extended upward.

Figure 5A:
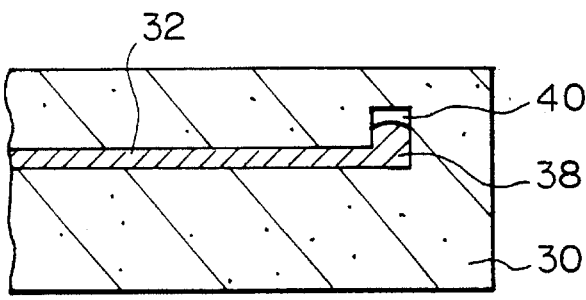
FIGS. 5(a) and 5(b) are sectional views of an aluminum nitride circuit board formed by the producing method of the present invention.
Figure 5B:
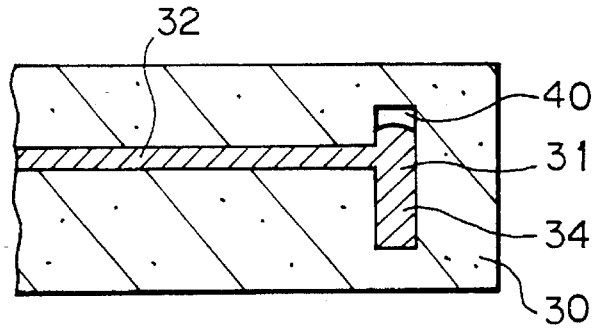

FIGS. 5(a) and 5(b) show situations after the green sheets shown in FIGS. 4(a) and 4(b) have been fired. Before the green sheet is fired, the metalizing paste is supplied to the wiring pattern 12 and so forth from the pool portion 40. Therefore, a blow hole remains only in the pool portion 40.

It is necessary to appropriately determine the volume of the pool portion 40 of the green sheet in accordance with the composition of the metalizing paste 38 to be used and the density of the aluminum nitride green sheet. In the case of a copper paste made by a conventional process, the volume of the paste becomes approximately less than 50% after the paste has been fired. When this copper paste is charged into a through-hole formed on the aluminum nitride green sheet and fired, a reduction of the volume of the copper paste caused by the liquidization of metal contained in the paste is a little larger than that of the volume in the through-hole. Therefore, a space of about 7 to 10% is made. Consequently, it is necessary to determine the volume of the pool portion 40 to be about 20% of the conductor portion.

When the metalizing paste 38 is liquidized in the wiring pattern 32, a necessary amount of paste flows to the conductor portion from the pool portion 40. Therefore, the pool portion 40 must be provided so that the pool portion can be communicated with the wiring pattern 32 when the metalizing paste 38 is liquidized. In order to supply the metalizing paste in such a manner that the metalizing paste flows into the wiring pattern 32, the pool portion 40 is disposed at a position higher than the conductor portion of the wiring pattern 32.

Whereas the circuit board is formed of a plurality of layered green sheets, through-holes are provided in the upper green sheets to be layered so that the positions of the through-holes coincide with the wiring pattern 32. In this manner, the pool portion 40 into which the metalizing paste 38 is charged can also be formed.

Figure 6A:
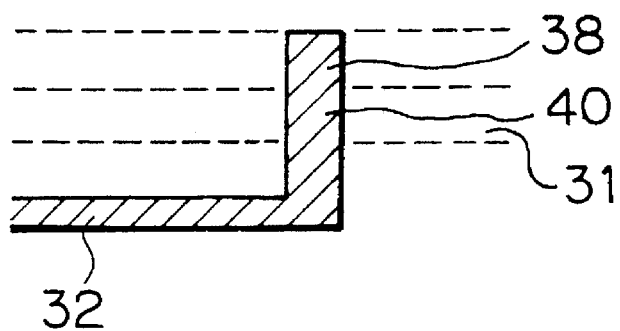
FIGS. 6(a) and 6(b) are schematic illustrations showing a method of forming a pool portion in a green sheet of an aluminum nitride circuit board.
Figure 6B:
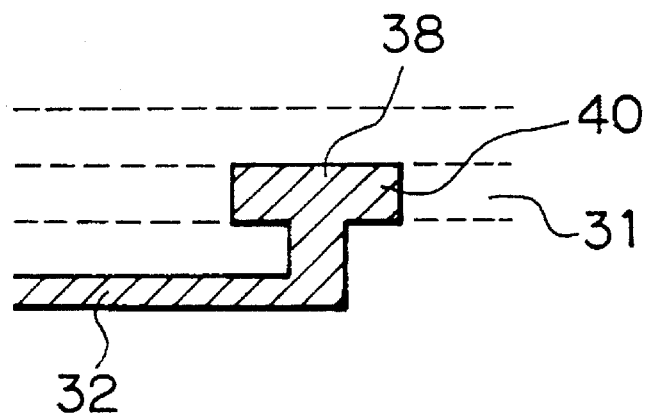

FIGS. 6(a) and 6(b) show situations in which the green sheets 31 are layered so as to form the pool portion 40. FIG. 6(a) shows an example in which the through-holes are formed in the same positions on a plurality of green sheets 31, which are layered so as to form the pool portion 40 into which the metalizing paste 38 is charged. FIG. 6(b) shows an example in which relatively large through-holes are formed on the upper green sheets disposed on the lower green sheet on which the wiring pattern 32 is formed. In this way, the inner volume of the pool 40 can be increased.

As described above, the configuration and forming position of the pool portion 40 may be appropriately determined in accordance with an arrangement of the conductor portion formed on the circuit board.

The layered body of the green sheets constructed in the aforementioned manner is pressed with a pressure not less than 100 kgf/cm$^2$ at a temperature not less than 50° C. so as to be integrated into one body. A binder component in the layered body is generally removed in a non-oxidizing atmosphere such as nitrogen gas at a temperature about 500° C.

The layered body is fired in a non-oxidizing atmosphere at a pressure higher than the atmosphere, and in general, the layered body is fired in nitrogen gas. It is preferable that the layered body is fired in a firing cell mainly made of aluminum nitride or boron nitride. It is necessary that the temperature increase rate is higher than 10° C./min at least from a temperature of approx 900° C. to a maximum temperature after firing process. If the temperature increase rate is lower than that, good results cannot be obtained.

The optimal firing temperature depends on the wiring material to be used and the firing additive contained in the green sheet of aluminum nitride. For example, in the case where $CaCO_3$ or $Y_2O_3$ from the periodic table IIa or IIIa compounds, are used as the firing additive of a green sheet, and copper or gold is used for the wiring material, the optimal firing temperature is approximately 1,800° C.

In the case where silver is used for the wiring material, a mixture of periodic table IIa and IIIb group compounds is preferably used as the firing additive to be contained in the green sheet, and it is preferable that the firing temperature does not exceed 1,650° C.

The firing condition of a green sheet in which copper is used for the wiring material is approximately the same as that of a green sheet in which gold is used, however, the behavior of copper and that of gold are different during a firing process. That is, in the case where gold is used for the wiring material, a large amount of sintering additive of the green sheet is mixed into the conductor portion while the green is being fired, so that the color of the conductor portion does not become gold, but it tends to be white silver. In the case where copper is used for the wiring material, the sintering additive component is not mixed into the conductor portion. Accordingly, when copper is used for the wiring material, the green sheet can be fired under the firing condition common for aluminum nitride, and impurities are scarcely mixed into the conductor portion, so that the electrical properties of the package are excellent. Therefore, copper can be said to be a preferable wiring material compared with gold and silver.

Example 2

A preferable example of the second embodiment will be explained as follows.

To an aluminum nitride powder having an average grain size of about 1 μm and obtained by a reducing nitride (carbothermal) process, calcium carbonate in amount of 0.5% by weight was added thereto as a sintering additive, and further an organic binder, a plasticizer and an organic solvent were added to make a slurry, and green sheets having a thickness of about 0.4 mm were formed by a doctor blade process.

The green sheet was punched to a predetermined size. On the upper surface of the first punched green sheet, three types of wiring patterns, the line widths of which were 150 μm, 200 μm and 300 μm, were formed using a copper paste made of copper powder, the average grain size of which was about 2 μm.

Through-holes, the diameter of which was 100 μm, were formed on each of the second and third green sheets, wherein the positions of the through-holes were adjusted to both ends of the wiring pattern provided on the first green sheet. The aforementioned copper paste was filled into each through-hole.

A punched green sheet on which a wiring pattern was not formed was prepared as the fourth green sheet. The aforementioned first, second, third and fourth green sheets were layered in order from the bottom to the top, and thermally pressed by a pressure of 200 kgf/cm² at a temperature of 60° C. for 5 minutes so as to be integrated into one body.

The layered and integrated green sheets were horizontally set in a furnace under the condition that the first green sheet was set downward. After the binder had been removed in nitrogen gas at a temperature of 500° C., the layered body was fired in nitrogen gas, the pressure of which was 5 kgf/cm², at a temperature increase rate of 25° C./min to a maximum temperature of 1,800° C., and the aforementioned conditions were held for 3 hours.

The fourth layer of the sintered body was ground and removed with a plane grinder, so that an end face of the conductor portion formed on the third layer was exposed. Then, the electrical properties of the conductor portion was inspected with a tester. As a result of the inspection, it was confirmed that any of the wiring patterns, the line widths of which were 150 μm, 200 μm and 300 μm, had good electrical properties.

Third Embodiment

In the production of aluminum nitride circuit boards on which copper is used for the conductor wiring material, the firing temperature is generally not less than 1,800° C. in the co-firing process, which is higher by at least 700° C. than the melting point of copper (1,083° C.). Therefore, the following problems may be encountered: diffusion of copper into the aluminum nitride ceramic in the process of densification as copper is melted also its vaporization, and interaction between the molten copper and the components in the ceramic such as a sintering additive and the like.

In the process of densification at a temperature of higher than 1,083° C., the inferior wetting properties of aluminum nitride with respect to melted copper are important in order to suppress the diffusion of copper into the ceramic. However, it is known that in general the wetting properties between ceramic and molten metal are greatly affected by impurities. Therefore, the contamination of impurities is unfavorable to suppress the wetting properties.

Whereas the densification of aluminum nitride ceramics starts at a temperature approximately not less than 1,500° C., the charged aluminum nitride powder and molten copper come into contact at a temperature from 1,083° C. to 1,500° C. Therefore, in the case where the wetting properties between aluminum nitride and molten copper are high or the reactivity is high in this temperature range, there is a possibility that the diffusion of copper into aluminum nitride is remarkably facilitated.

Also, there is a possibility that the contamination of impurities lowers the melting point of the metal and facilitates the diffusion of copper.

As described above, from various reasons, in the conventional method for producing aluminum nitride circuit boards, it is preferable to use a metal which is as pure as possible.

In the third embodiment, it is an object to increase the adhesive strength between the inner conductor portion and aluminum nitride ceramics. In order to attain the object, although impurities are mixed, it is necessary that the impurities do not facilitate the diffusion of cooper into ceramics, and that the impurities do not facilitate the diffusion of the sintering additive and aluminum into the molten copper. It is also necessary that the impurities do not diffuse into the ceramics, impede the sintering, and deteriorate the characteristics of the ceramics.

The inventors have found that titanium and titanium compounds can be used as an additive to satisfy various conditions.

That is, when the co-firing was conducted in a system in which titanium or titanium compounds were added to copper in an amount of not less than 0.2% by weight and not more than 20% by weight, copper was neither diffused into aluminum nitride ceramic, nor the components in the ceramic were diffused into the copper. Although copper and titanium, or copper and titanium compounds were uniformly mixed before the co-firing, the titanium or the titanium compounds only existed on the interface between copper and aluminum nitride after the co-firing, and copper of high purity was formed in the center of the conductor portion. Preferable results were also obtained from the viewpoint of the adhesive properties and the electric properties of the conductor wiring portion.

When an aluminum nitride circuit board is produced, first, in the copper paste for forming the inner conductor, metallic titanium or titanium compounds are added to the copper powder, wherein an amount of the metallic titanium or the metallic titanium equivalent of the compounds is not less than 0.2% by weight and not more than 20% by weight, and preferably not less than 0.5% by weight and not more than 10% by weight, and further a vehicle is added so as to obtain a sufficiently kneaded paste. Components of the vehicle are a binder such as an acrylic binder or ethyl cellulose, and a solvent such as butyl carbitol acetate, terpineol or dioctyl phthalate.

Next, the aforementioned copper paste is printed or charged onto an aluminum nitride green sheet or into a through-hole provided on the green sheet, wherein the aluminum nitride green sheet contains at least one of the compounds of the periodic table IIa group and IIIb group by an amount of not less than 0.1% by weight and not more than 10% by weight in all inorganic components. In the compounds of the periodic table IIa and IIIb groups, one of $CaCO_3$, $CaF_2$, $Y_2O_3$, $YF_3$, $La_2O_3$ and $LaF_3$ is preferably used.

Next, the green sheet having an inner conductor portion is layered, and a protective green sheet is layered on the uppermost layer or under the lowermost layer in the case where a via hole portion is provided, so that the conductor portion is not exposed onto the outer surface of the layered body. Then, the layered body is heated and pressed so as to be formed into one unit. The heating and pressing conditions are as follows: at a temperature of 50° C. to 80° C., the pressing force of 100 to 250 $kgf/cm^2$ is applied for several minutes.

When the integrated body is treated in a flow of nitrogen gas, organic components are removed at a temperature of about 500° C.

In order to obtain a dense sintered body, the firing is conducted in an atmosphere of nitrogen gas under the following condition: the temperature is preferably raised at a rate not less than 10° C./min; a maximum temperature not less than 1,600° C. and not more than 1,900° C., and preferably not less than 1,750° C. and not more than 1,850° C.; the layered body is heated for not less than 1 hour and not more than 20 hours, and preferably not less than 3 hours and not more than 10 hours.

In this case, a sintering jig having a cell structure is preferably used, and a material chosen from aluminum nitride, tungsten, boron nitride, molybdenum, and preferably boron nitride, is used.

When the surface of the sintered body obtained by the above method is ground or polished, the protective uppermost and lowermost layers are removed, and a circuit board is obtained, on which the inner conductor is exposed onto the surface of the sintered body.

After the inner conductor has been exposed, a thin film is formed on the surface, or the surface is subjected to plating treatment if necessary.

The reason that the metallic titanium equivalent of the titanium component contained in the copper paste for forming the inner conductor is not less than 0.2% by weight and not more than 20% by weight, is described as follows: In the case where an amount of added titanium component is smaller than 0.2% by weight, the amount of inclusion formed on the interface between copper and aluminum nitride ceramics is very small, and in the case where the amount of added titanium component exceeds 20% by weight, the amount of inclusion is too large, so that the electric properties deteriorate, and the essential object cannot be accomplished.

The optimal amount of added titanium or titanium compounds depends on the width of the wiring of the inner conductor, the thickness of the conductor portion, and the diameter of the via hole portion. For example, even if the addition amount is small, breakage of wire is not caused when the width of wiring is narrow, however, breakage of wire is caused when the width of wiring is wide in the case where the same paste is used. On the contrary, when the addition amount is large and the width of wiring is narrow, an amount of inclusion formed on the interface is fluctuated, and the electrical characteristics deteriorate.

It is preferable that the inclusion is uniformly formed all over the interface between the conductor portion and ceramics. However, depending on the configuration of wiring, a thick inclusion layer may be formed in one portion, and the inclusion layer may hardly be formed in the other portion. Accordingly, the addition amount is preferably adjusted to be in a range from 0.5% by weight to 10% by weight.

One of metallic titanium, titanium diboride and titanium dioxide can be used for the added titanium component. In the case of titanium diboride, a distribution of boron different from that of titanium can be observed in the sintered body. Therefore, it can be judged from the distribution of nitrogen that boron nitride has been formed. In this case, an influence on the conductor and base board has not been found.

Also, in the case of titanium dioxide, a distribution of titanium superimposing the distribution of nitrogen has been finally found. In this case, the existence of titanium in the form of an oxide has not been found.

The periodic table IVb group metals or compounds other than titanium may be used for the impurities to be mixed in the copper paste. For example, the same effects can be provided when one of metallic zirconium, zirconium diboride and zirconium dioxide is used. However, in the case where zirconium diboride is added, a portion that has not been sufficiently densified is generated in the via hole portion. Especially if zirconium diboride is used, the amount of which is not less than 10% by weight, problems are caused from the viewpoint of quality. Presumably, the deterioration in quality is caused by boron nitride generated during the firing process. In any case, it is difficult to adjust the relation between the addition amount of zirconium diboride and the wiring size and to adjust a relation between the addition amount of zirconium diboride and the conductor resistance. In the case where metallic zirconium is used, a dry mill is not suitable, furthermore, the powder of metallic zirconium must be preserved in alcohol. Thus, the handling of metallic zirconium is problematic.

Example 3

To an aluminum nitride powder having an average grain size of about 1 μm and obtained by a reducing nitride (carbothermal) process, 3% by weight of yttrium oxide was added thereto as a sintering additive, and an acrylic binder, a plasticizer and an organic solvent were added to make a slurry with a ball mill, and a green sheets having a thickness of about 0.4 mm were formed by a doctor blade process.

Green sheets were formed in the same manner, except that calcium carbonate having an amount of 0.2% by weight as a sintering additive was added.

On the other hand, to a copper powder having an average grain size of about 2 μm, a metallic titanium powder having an average grain size of about 0.5 μm was added so that the weight percent could be 0.2, 0.5, 1.0, 2.5, 5.0, 10.0 and 20. To each of the mixtures, an acrylic binder and a vehicle composed of butyl carbitol acetate and terpineol were added, and then the mixture was kneaded by a kneader so as to form a copper paste containing titanium.

In this connection, the amount of the added vehicle was changed according to a portion to be coated with the paste, so that a paste for plane wiring was adjusted to low viscosity, and a paste for charging the via hole portion was adjusted to high viscosity.

The paste was screen-printed on each green sheet to form plane wirings, the width of which were 300 μm and 200 μm. After these wirings had been sufficiently dried, another green sheet having the same composition as that of the aforementioned first green sheet, but having no copper paste, was layered on the print surface of the first green sheet. Then, the layered green sheets were thermally pressed, at a temperature of 60° C. with a pressure of 200 kgf/cm$^2$, for 5 minutes. In this way, the green sheets were integrated into one body.

Next, the binder of the green sheet layered body was removed in a flow of nitrogen at a temperature of 550° C., and then the layered body was fired in nitrogen gas under the following conditions: the N$_2$ gas pressure was 3 kgf/cm$^2$; the temperature increase rate was 20° C./min; the maximum temperature was 1,800° C.; and the holding time was 3 hours.

After each obtained sintered body had been cut in parallel with the inner wiring, the longitudinal section of the inner conductor was exposed when it was ground. Then, the formation of the inner conductor was observed.

As a result, the breakage of wire was not observed in any combination of the green sheet and the paste.

Figure 7:
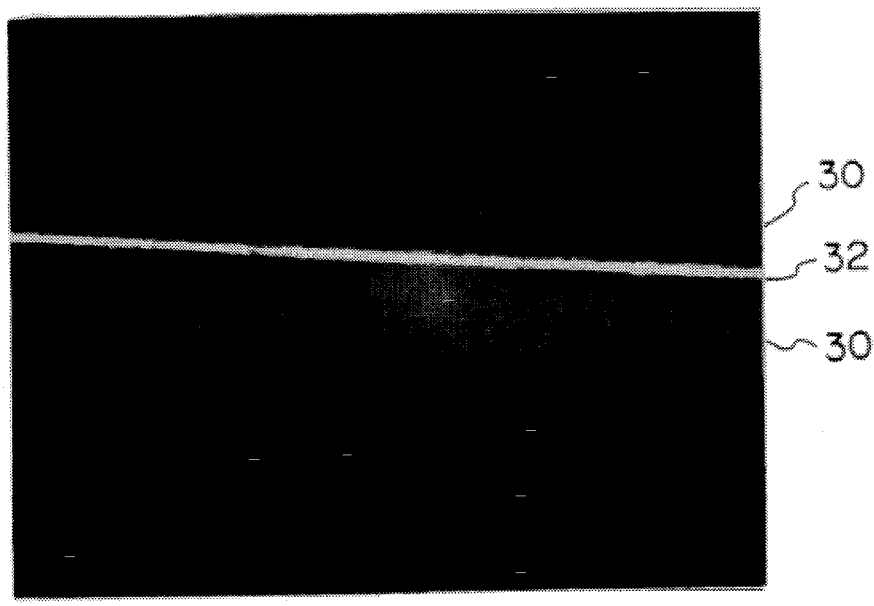
FIG. 7 is a photograph showing the micro-structure on a section of an inner conductor portion of an example of an aluminum nitride circuit board.

FIG. 7 shows an example of a ground section of a sintered body in the case where an aluminum nitride green sheet containing yttrium oxide in an amount of 3% by weight, and a copper paste containing metallic titanium in an amount of 5% by weight were used. Numeral 30 is aluminum nitride ceramics, and numeral 32 is an inner conductor wiring portion. It can be observed that the inner conductor wiring portion is formed without breakage of wire.

Comparative Example

On the same aluminum nitride green sheet as that in Example 3, wirings, the width of which were 300 μm and 200 μm, were formed by means of screen-print using a copper paste containing metallic titanium in an amount of 0.05% by weight. After the formed wirings had been dried, an aluminum nitride green sheet was layered on the print surface so as to be integrated into one body, and then the layered body was fired under the same condition as that in Example 3.

The obtained sintered body was cut and ground so that the longitudinal section of the inner conductor could be exposed, and the formation of the inner conductor was observed.

As a result, approximately the same inner conductor, as that obtained in the case of a copper paste containing no titanium, was observed.

In this case, the thickness of the inner conductor was not uniform, and portions of the inner conductor close to the ends of the wiring tended to be thick, and the breakage of wire occurred as if the molten metal had been repelled.

Figure 8:
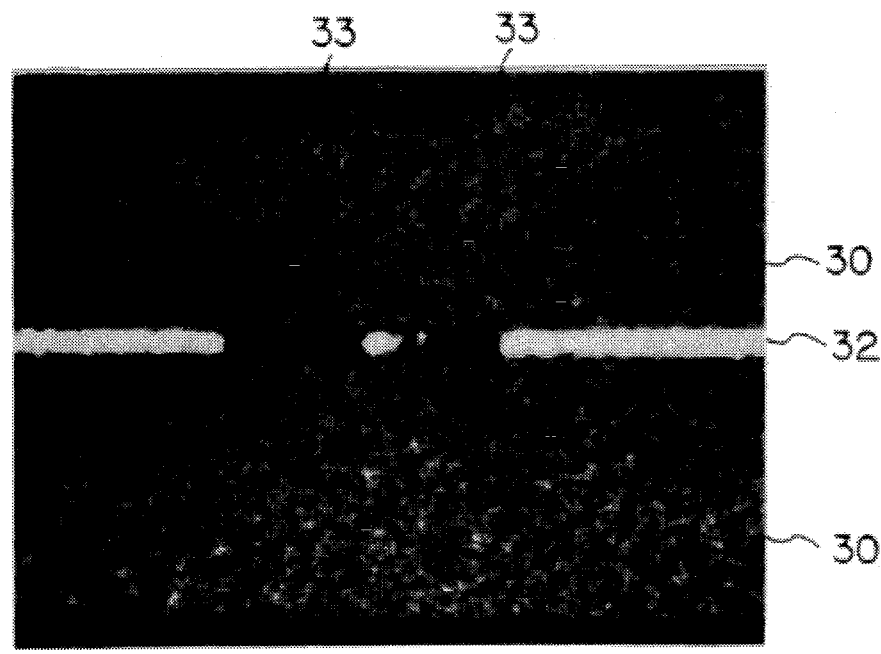
FIG. 8 is a photograph showing the micro-structure on a section of an inner conductor portion of another example of an aluminum nitride circuit board.

FIG. 8 shows a comparative example showing a sintered body in which an aluminum nitride green sheet containing yttrium oxide in an amount of 3% by weight was used. Numeral 30 is aluminum nitride ceramics, numeral 32 is an inner conductor wiring portion, and numeral 33 is a void portion. In a black portion in the middle of the inner conductor wiring portion 32, breakage of wire occurred. The molten metal was laterally repelled and the wire was broken.

Example 4

A large number of through-holes, the diameter of which was 240 μm, were formed by means of punching, at a pitch of 1,300 μm, on the same aluminum nitride green sheet as that used in Example 3. After that, the copper paste containing a titanium component of each concentration prepared in Example 3 was charged into the through-holes.

After having been dried, three green sheets formed in the same manner were layered. Further, protective green sheets (having no through-holes) were layered on the uppermost and lowermost layers. Then, the layered body was heated and pressed so as to be integrated into one body.

The binder was removed from the layered body under the same condition as that of Example 3, and the layered body was fired. The obtained sintered body was ground with a plane grinder so that both ends of the via hole portions were exposed.

A tester was set at both ends of the via hole portions so as to check the electrical communication, and the component distribution was checked in a portion close to the interface between the copper conductor and the aluminum nitride ceramics with an electronic probe microanalyzer (EPMA).

As a result of the check, in any combination of the green sheet and the copper paste, titanium was partially distributed on the interface between the copper portion and the aluminum nitride ceramic, and the diffusion into the aluminum nitride ceramics was not observed.

The distribution of titanium around the circumference of the interface was varied by the addition of titanium. In the case where the addition was not more than 0.5% by weight, titanium was distributed in not more than 30% of the entire circumference. However, in the case where the addition amount was not less than 5% by weight, titanium was distributed in 60 to 100% of the entire circumference.

As the addition of the titanium component was increased, the distribution ratio on the circumference of the interface was increased, and further the distributed thickness also increased. In this case, the increase in the distributed thickness was in a direction from the interface to the center of the via hole portion, and an increase in the distributed thickness in a direction from the interface to the aluminum nitride ceramic was not observed.

The distribution of titanium was approximately superimposed on the distribution of nitrogen. Therefore, almost all the titanium presumably existed in the form of titanium nitride.

Concerning the distribution of oxygen, it can be considered that oxygen was contained in the second phase and that oxygen was mixed in the process of grinding. However, the existence of oxygen in the form of titanium oxide was not confirmed. In any case, oxygen was not distributed in the copper via hole portion.

Figure 9A:
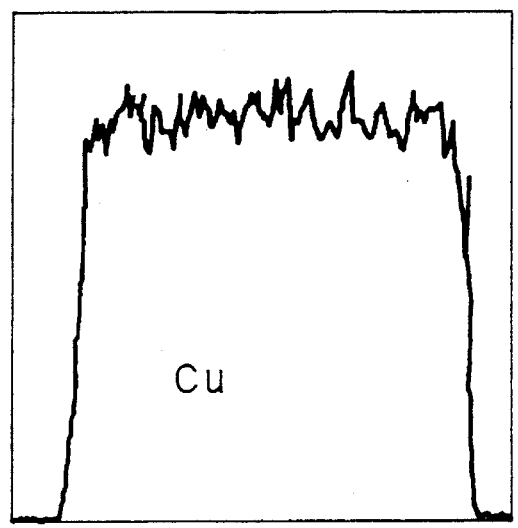
FIGS. 9(a)–9(c) are EPMA (Electron probe microanalysis) graphs showing a result of line analysis of copper, aluminum and titanium on a cross section of a via hole portion of an aluminum nitride circuit board.
Figure 9B:
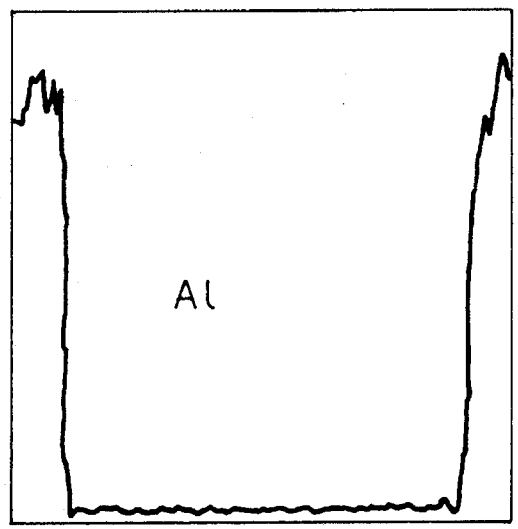
Figure 9C:
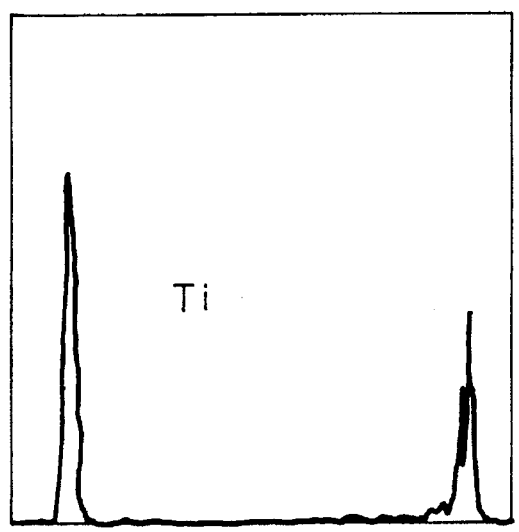

FIGS. 9(a)–9(c) show a result of measurement by an EPMA, wherein the measurement was conducted on the end surface of the via hole portion of a sintered body in the transverse direction. In this case, the sintered body was formed in the following manner: the conductor was formed in the via hole using a copper paste containing metallic titanium in an amount of 5.0% by weight, on an aluminum nitride green sheet into which $CaCO_3$ in an amount of 0.2% by weight was added.

FIGS. 9(a), 9(b) and 9(c) show results of line analysis of copper, aluminum, and titanium, respectively. From the results of the analysis, it can be seen that copper existed only in the via hole portion, aluminum existed in a portion except where copper existed, and titanium existed at the interface between copper and aluminum.

Example 5

Using a copper paste containing metallic titanium in an amount of 5.0% by weight, which was the same as used in the above-mentioned Example 3, conductive wirings, the width of which was 400 μm, were formed on the same aluminum nitride green sheet by means of screen-print. Also, a plurality of through holes, the diameter of which was 360 μm, were formed by a punching process and these through holes were filled with pure copper paste, containing neither metal of the periodic table IVa group, nor any compound thereof. The aluminum nitride green sheets thus formed are layered in such a manner that the conductive wirings and the pure copper paste in the through holes were connected to each other. On a surface of the layered aluminum nitride green sheets thus made a protective aluminum nitride green sheet was layered, so that any conductive paste was not exposed to the outer surface of the layered integrated body. Then, the binder was removed from the layered body and the layered body was fired under the same condition as that in Example 3.

The obtained sintered body was cut and ground so that the ends of through holes in which pure copper paste was filled could be exposed. Good electrical connection of the conductive wirings of the layered body thus made was confirmed by using a tester.

In the case of a conventional aluminum nitride circuit board on which copper is used as wiring material, molten copper hardly wets aluminum nitride. Accordingly, there is a possibility that the molten copper is repelled and breakage of wire is caused. However, in the case of an aluminum nitride circuit board provided by the method of this embodiment described in the above examples, the wetting properties can be improved when an inclusion exists at the interface between cooper and ceramics, so that the breakage of inner conductor wire can be effectively prevented.

In the case of the conventional aluminum nitride circuit board, when the board is damaged, cracks are selectively caused on the interface between the via hole portion and ceramics, so that the strength of the board is lowered. However, in the case of this embodiment, the fastening strength on the interface between the via hole portion and ceramic is increased, so that cracks do not exist on the interface between the via hole portion and ceramic. Therefore, the mechanical strength of the circuit board can be improved.

We claim:

1. An aluminum nitride circuit board comprising:

an aluminum nitride ceramic body;

an inner conductor metal, which is to be used as a wiring material, formed in said aluminum nitride ceramic body, said inner conductor metal being mainly made of copper, a melting point of which is lower than the firing temperature of said aluminum nitride ceramic body; and a layer mainly made of a periodic table IVb group metal or compound, such as titanium, zirconium, or hafnium, formed in an interface between said aluminum nitride ceramic body and said inner conductor metal.

2. An aluminum nitride circuit board according to claim 1, wherein said layer is mainly made of titanium.

* * * * *

UNITED STATES PATENT AND TRADEMARK OFFICE
CERTIFICATE OF CORRECTION

PATENT NO. : 5,464,950
DATED : Nov. 7, 1995
INVENTOR(S) : HORIUCHI et al.

It is certified that error appears in the above-indentified patent and that said Letters Patent is hereby corrected as shown below:

TITLE PAGE:

[75] Inventors: Change "Koishiro" to --Koichiro--;

[30] Foreign Application Priority Data: Change "4-299912" to --4-299192--.

Signed and Sealed this

Twenty-third Day of July, 1996

*Attest:*

BRUCE LEHMAN

*Attesting Officer*  *Commissioner of Patents and Trademarks*